United States Patent [19]

Taylor

[11] 4,236,038

[45] Nov. 25, 1980

[54] HIGH CAPACITANCE MULTILAYER BUS BAR AND METHOD OF MANUFACTURE THEREOF

[75] Inventor: Michael J. Taylor, Mesa, Ariz.

[73] Assignee: Rogers Corporation, Rogers, Conn.

[21] Appl. No.: 59,068

[22] Filed: Jul. 19, 1979

[51] Int. Cl.³ .............................................. H01B 5/14
[52] U.S. Cl. ................................. 174/72 B; 361/306; 29/830
[58] Field of Search ..................... 174/72 B; 361/306; 29/625, 628

[56] References Cited

U.S. PATENT DOCUMENTS

| | | | |
|---|---|---|---|
| 1,999,137 | 4/1935 | Flewelling | 174/72 B X |
| 3,396,230 | 8/1968 | Crimmins | 174/72 B |
| 3,505,575 | 4/1970 | Barbini | 361/306 X |
| 3,778,735 | 12/1973 | Steenmetser | 174/72 B UX |
| 3,886,654 | 6/1975 | Erdle | 174/72 B X |
| 4,114,120 | 9/1978 | Lupfer | 361/306 X |

*Primary Examiner*—Roy N. Envall, Jr.
*Attorney, Agent, or Firm*—Fishman and Van Kirk

[57] ABSTRACT

A high capacitance bus bar is presented having at least two separated conductive plates between which a plurality of capacitive ceramic dielectric chips are positioned and adhered. The outer surfaces of the dielectric chips are metalized and have a roughened or coarse finish to provide contact between the dielectric chips and the conductive plates, thereby permitting use of nonconductive adhesive to bond the parts of the assembly together.

18 Claims, 4 Drawing Figures

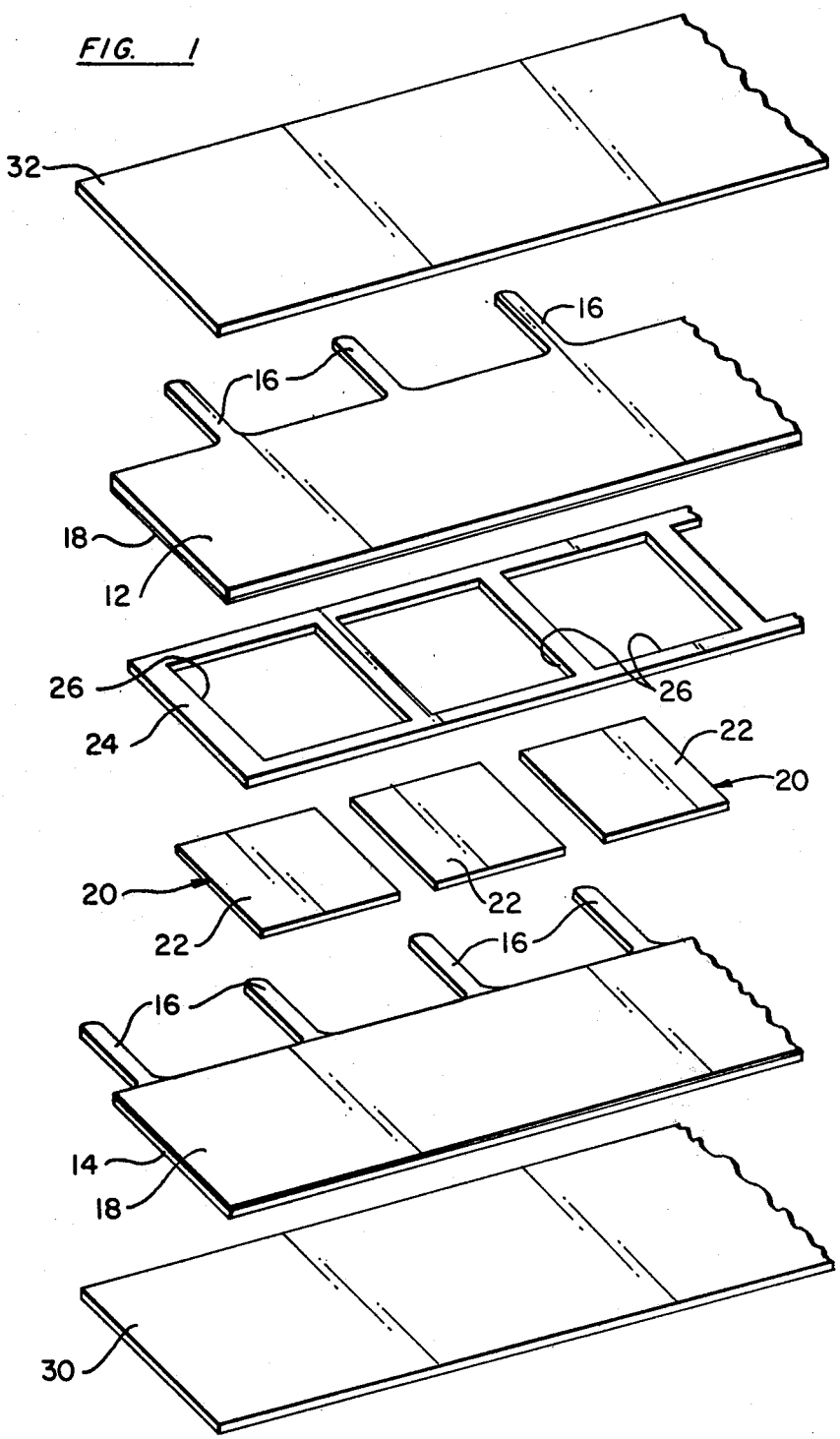

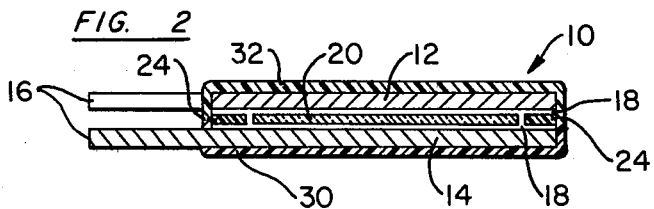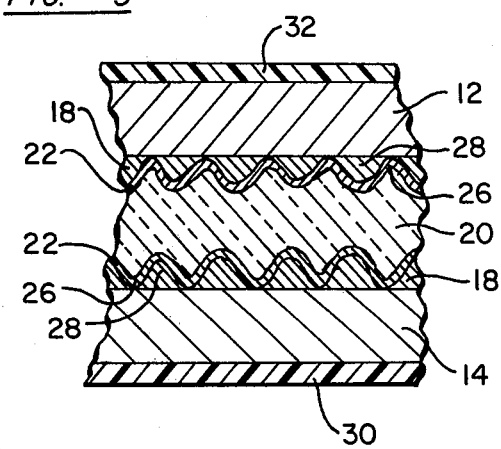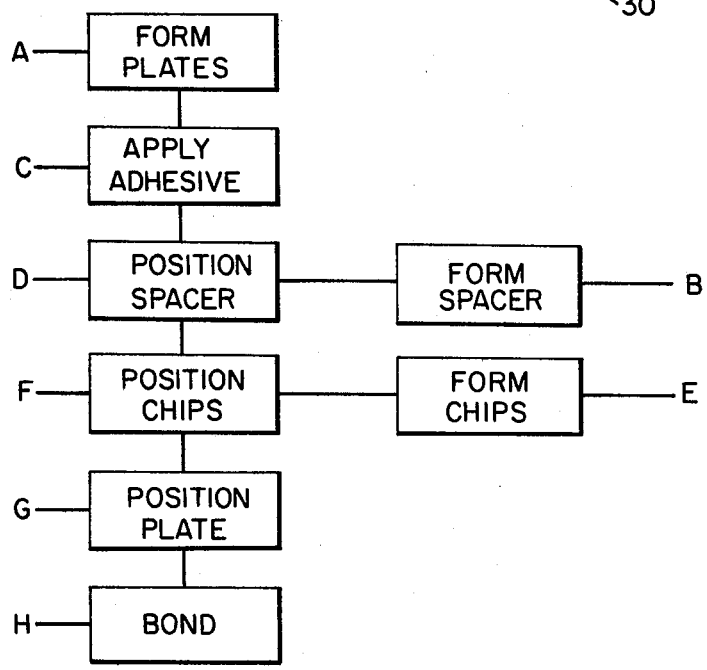

HIGH CAPACITANCE MULTILAYER BUS BAR AND METHOD OF MANUFACTURE THEREOF

BACKGROUND OF THE INVENTION (1) Field of the Invention

This invention relates to bus bars, especially relatively small or miniature bus bars. More particularly, this invention relates to multilayer bus bar assemblies, and the method of manufacture thereof, wherein the bus bar assembly incorporates capacitive elements between layers of bus conductors to provide high capacitance bus bars.

(2) Description of the Prior Art

Conventional bus bars of relatively small or miniature size have been known in the art for a number of years. These devices are used for power and/or signal distribution in many systems, such as, for example, computer back panels and integrated circuit systems. Such prior art multilayer bus bars comprise at least two conductive plates (usually in the form of elongated strips or bars of copper) separated by an insulating film. A typical prior art bus bar of this type may use copper conductors having a thickness of about 10 mils, and the overall dimensions of the bus bar may be from about 0.019 to 0.120 inches thick, from about 0.150 to 0.200 inches wide and range in length up to about 16 inches. Typically, the separating insulating layer is a plastic dielectric film such as the polyester material known as MYLAR. The MYLAR separator layer and the conductive plates are bonded together by an adhesive. Prior art bus bars of this type have relatively low capacitance.

It has also been suggested in the prior art to construct miniature multilayer bus bars of this type having high capacitance. It has been proposed to achieve the objective of high capacitance. It has been proposed to achieve the objective of high capacitance by incorporating capacitive elements in the bus bar assembly between the conductive layers of a multilayer bus bar. Reference is hereby made to U.S. Pat. Application Ser. Nos. 950,265 and 950,266, both of which are owned by the assignee of the present invention, and both of which relate to multilayer bus bar systems having high capacitance elements between conducting layers of the bus bar assembly. These high capacitive elements are thin layers or chips of dielectric material with opposite surfaces coated with a thin, integral and continuous film of conductive material. Some or all of these prior art systems have included the feature of the use of conductive adhesive to bond together the multilayer bus bar assembly and provide the necessary electrical contact between the conductive layers of the bus bar assembly and the conductive outer surfaces of the capacitive elements between the bus bar layers.

While these prior art systems are workable, the use of the conductive adhesive imposes serious processing limitations, because considerable care must be exercised in the manufacturing process to make sure that a short circuit path is not established between the conductive layers of the bus bar by the conductive adhesive. Any such short circuit, whether it occurs during the manufacturing process or whether it occurs during handling or use of the device after manufacture, will destroy the effectiveness and utility of the bus bar. Thus, in the manufacturing process, great care must be exercised to make sure that the conductive adhesive (which is typically a thermoplastic material) does not leak out of the assembly to cause electrical leaks or short circuit paths with high dissipation factors. Thus, only relatively low pressures (on the order of 10–15 psi) can be employed in assembling these prior art devices, encapsulation techniques are limited, and limits are imposed on the thickness of the device in that the layers cannot be squeezed together to produce as thin a device as might be desired. The presence of the conductive adhesive in the finished device also poses a continual problem of possible establishment of a short circuit path during the lifetime of the device.

SUMMARY OF THE INVENTION

The bus bar of the present invention, and the method of manufacture thereof, eliminate the need for the use of conductive adhesive, thereby completely eliminating the potential problems posed by the conductive adhesive in prior art devices.

As in the prior art, the bus bar of the present invention comprises at least two spaced apart electrically conductive plates or layers which form the busing elements. One or more capacitive elements are located between the conductive plates of the bus bar. The capacitive elements are thin ceramic chips of high dielectric material, the opposite surfaces of which have been coated with a thin, integral and continuous film of conductive material. The opposite surfaces of the ceramic chips are formed so as to be rough or coarse, so that the conductive layer also has a rough or coarse finish. A nonconductive adhesive is used to bond the conductive plates and the capacitive chips. Direct contact is established between the conductive plates and the high spots on the rough surfaces of the capacitive elements, while adhesive is retained in the valleys of the rough surfaces of the capacitor to bond the opposed surfaces of the capacitive element to the spaced apart plates. Thus, the necessary direct electrical contact and physical bonding are achieved without any of the actual or potential drawbacks of conductive adhesive.

Accordingly, one object of the present invention is to provide a novel and improved multilayer bus bar and method of manufacture thereof.

Another object of the present invention is to provide a novel and improved multilayer bus bar and method of manufacture thereof wherein the multilayer bus bar assembly incorporates capacitive elements.

Still another object of the present invention is to provide a novel and improved multilayer bus bar and method of manufacture thereof wherein the assembly is intimately bonded together with nonconductive adhesive while providing direct physical and electrical contact between conductive layers of the bus bar and conductive coatings on internal capacitive elements.

BRIEF DESCRIPTION OF THE DRAWINGS

Referring to the drawings, wherein like elements are numbered alike in the several FIGURES:

FIG. 1 shows an exploded prospective view of a bus bar in accordance with the present invention;

FIG. 2 shows an elevation cross section view of an assembled bus bar taken along line 2—2 of FIG. 1;

FIG. 3 shows an enlarged view of a central portion of the bus bar assembly of FIG. 2;

FIG. 4 is a flow diagram of the manufacturing process.

DETAILED DESCRIPTION OF THE INVENTION:

Referring simultaneously to FIGS. 1, 2 and 3, bus bar 10 has a first conductive plate 12 and a second conductive plate 14. Each of the plates 12 and 14 has a plurality of distribution prongs or tangs 16 extending therefrom, these tangs serving for electrical distribution and/or physical mounting of the bus bar on a printed circuit board or other structure. Conductive plates 12 and 14 are preferably tin plated copper elements approximately 10 mils thick and ranging in width from 0.150 to 0.200 inches and ranging in length from about 2 to 16 inches.

In the manufacturing process the inwardly facing surfaces of plates 12 and 14 are coated with a coating 18 of nonconductive adhesive which flows freely when melted. The adhesive is preferably a thermoplastic polyester adhesive, such as Morton 76Pl (made by Morton Chemical Company Division of Morton International Incorporated), which has low melt viscocity (on the order of about 100 cps) and flows freely at about 315° F. Alternatively, the adhesive may be a thermosetting material if the cure thereof takes place during or after melting in manufacturing process.

Capacitive elements are positioned between the inwardly opposing faces of plates 12 and 14. These capacitive elements are in the form of a plurality of ceramic dielectric chips 20 each having a relatively high dielectric constant. Generally speaking, the ceramic dielectric chips have a thickness in the range from about 0.005 inches to about 0.015 inches and have a surface dimension in the range of from about 0.2 inches by 0.2 inches to about 0.2 inches by 3.0 inches. Those surface dimensions represent the dimensions of opposed generally parallel plate surfaces of the chips. The ceramic material from which the chips are formed as a relatively high dielectric constant, preferably in excess of 8,000. Ceramic materials that are commonly used for capacitors may be used for the chips employed in the present invention. An exemplary and preferred ceramic material is barium titanate and modifications thereof. Each of the chips 20 is coated on the opposed plate faces with a thin, intimate and continuous conductive coating 22 of metal, such as silver, or conductive polymer. It will be understood that although only one of each of the coated surfaces 22 is visible in FIG. 1, the opposite parallel surface of each chip 20 will also be conductively coated. In effect, each chip 20 forms a small capacitor.

An insulating separator layer or spacer 24 is also positioned between the conductive plates 12 and 14. The presence of spacer 24 is not absolutely required, but it is preferable to insure separation between conductive plates 12 and 14. Windows 26 are formed in spacer 24, and the chips 20 are positioned in windows 26. It will be understood that, depending on the size of the chips 20, several of the chips may be located in each window 26. In addition to providing insulation between the spaced conductive plates 12 and 14, spacer 24 also promotes parallel contact between the surface of the plates 12 and 14 and the opposed conductive surfaces 22 of the capacitive chips, thereby enhancing the capacitive capabilities of the assembly.

The steps involved in assembly of the device are shown in FIG. 4. Plates 12 and 14 are formed, such as by die stamping, in step A, and spacer 24 is formed in a separate step B, also such as by die stamping. The adhesive 18 is then applied to the inwardly facing surfaces of plates 12 and 14 in step C. The adhesive is preferably in the form of a liquid which can be applied in any convenient fashion such as painting, spraying, roll coating, etc. In step D, spacer 24 is placed on the inwardly facing surface of one of the plates 12 or 14. The capacitive chips 20 (which are formed in step E) are then placed in the window 26 of spacer 24 in step F so that one of the flat plate surfaces of each chip is in contact with the inwardly facing surface of the plate 12 or 14 on which the separator has been placed. The second plate is then positioned over the spacer and chips in step G so as to form a sandwich with the spacer 24 and chips 20 sandwiched between the plates 12 and 14. This sandwich assembly is positioned on a first outer layer of MYLAR insulation 30 and is covered with a second outer layer of MYLAR insulation 32. Insulation layers 30 and 32 are slightly larger than the bodies of plates 12 and 14 so that they can be wrapped around the edges of and encapsulate the sandwich assembly of plates 12 and 14 and chips 20. The inwardly facing surfaces of insulation layers 30 and 32 are also coated with nonconductive adhesive so as to bond, respectively, the outer surfaces of plates 12 and 14. This entire assembly is then bonded under heat and pressure in step H to form an integral encapsulated assembly. Bonding occurs at a temperature of from about 300° F. to about 350° F. and at a pressure of from about 50 psi to about 200 psi, the heat and pressure being applied for a period of from about 5 minutes to about 60 minutes. The pressure is distributed evenly across the entire assembly so that when the adhesive melts excess adhesive is squeezed out of the assembly, whereby physical and electrical contact is established between the outer plates 12 and 14 and the conductive surfaces of the chips, as will be explained in more detail hereinafter. Bonding under heated pressure is accomplished in a press, and the permissible pressure is limited only by the compressive strength of the capacitive chips.

The encapsulation of the conductive plates 12 and 14 by outer sheets 30 and 32 is preferable but not necessary. Furthermore, if the plates are to be encapsulated, any other method of encapsulation known in the art can be used.

As can be seen in FIG. 2, since the adhesive is nonconductive, the adhesive can be permitted to flow in the assembly and actually flow between the conductive plates 12 and 14. This not only enhances bonding, but it also permits the parts to be squeezed together to squeeze out excess adhesive whereby a thinner sandwich structure can be achieved.

Referring now to FIG. 3, a critical feature of the present invention is illustrated. In accordance with the present invention, the opposed plate surfaces of the chips are formed so that they are deliberately roughened or coarse and nonporous so that the plate surfaces of the chips are coarser than the inwardly facing surfaces of the conductive plates 12 and 14 to which the chips are bonded. The roughness or coarseness of the plate surfaces of the chips is on the order of 300 microinches or more. That is, the plate surfaces of the chips, although flat and parallel on a macroscopic basis, have, on a microscopic basis, hills 26 and valleys 28 where the distance between the top of the hill and the bottom of the valley is on the order of 300 microinches or more. When the assembly is squeezed together under pressure during the manufacturing operation, the adhesive is squeezed out between the hills 26 and the inwardly facing surfaces of plates 12 and 14, so that the tops of the hills 26 actually come into physical and electrical contact with the inwardly facing surfaces of plates 12 and 14. By the same token, adhesive is squeezed into the valleys 28 between the hills, so that a firm physical bond is also established through that adhesive between the plates 12 and 14 and the opposite plate surfaces of the chips. Thus, direct electrical contact is established between parts of the roughened surfaces of the chips and the plate conductors 12 and 14, while bonding is achieved between other parts of the chips and the plate conductors.

As previously indicated, a preferred dielectric material for chips 20 is barium titanate. The plate surfaces of the chips can be roughened in several ways. For example, zirconium oxide can be mixed with the barium titanate during the process of forming the chips. Because of the higher melting point of the zirconium oxide (i.e. higher than barium titanate) the zirconium oxide does not melt during the fireing process of chip formation. Rather, the zirconium oxide remains in its particle solid state and forms roughened plate surfaces on the opposite plate surfaces of the chip. The chips are then coated with a thin coating of silver or other conductive material, and the thin conductive coating conforms to the roughened surfaces of the base material of the chips thereby retaining the coarseness or roughness of the chip surfaces. Alternatively, the roughened surfaces can be formed by mixing particles of a ceramic material, such as barium titanate, for example, with the conductive coating to be applied to the chips. These particles of ceramic material in the conductive coating will serve to form the roughened surface of the opposed plate surfaces of the chips.

Alternatively, the plate surfaces of the chips can be retained relatively smooth, and the inwardly facing surfaces of the conductors 12 and 14 can be roughened, such as by sand paper, coining the dye from which they are formed, etc. When the elements are assembled, the same end result will be obtained: i.e., there will be direct physical and electrical contact between the "hills" on the roughened inner surfaces of the plate conductors 12 and 14 and the relatively smooth plate surfaces of the chips, while adhesive bonding will be achieved across the adhesive retained between the "valleys" on the inner surfaces of the conductors 12 and 14 and the chips. Thus, it can be seen that the essential feature is to establish a structure wherein a differential surface roughness or coarseness (on the order of 300 microinches or more) is established between the plate surfaces of the chips and the inwardly facing surfaces of the conductors 12 and 14. This differential roughness or coarseness insures that there will be direct physical and electrical contact between parts of each chip and the conductors while also retaining adhesive between other parts thereof to accomplish adhesive bonding.

While preferred embodiments have been shown and described, various modifications and substitutions may be made thereto without departing from the spirit and scope of the invention. Accordingly, it is to be understood that the present invention has been described by way of illustration and not limitation.

What is claimed is:

1. A bus bar including:
   at least two spaced apart conductive elements having inwardly facing surfaces;
   capacitive means positioned between said conductive elements, said capacitive means comprising a dielectric material between conductive outer surfaces;
   the conductive outer surfaces of said capacitive means being of different roughness relative to the inwardly facing surfaces of said conductive plates;
   at least part of each of said conductive outer surfaces of said capacitive means being in physical and electrical contact with at least part of the adjacent inwardly facing surface of one of said conductive elements; and
   nonconductive adhesive bonding said conductive element to said capacitive means.

2. A bus bar as in claim 1 wherein:
   the differential roughness between the conductive outer surfaces of said capacitive means and the inwardly facing surfaces of said conductive plates is on the order of at least 300 microinches.

3. A bus bar as in claim 1 including:
   insulating spacer means between said conductive elements, said spacer means having opening for said capacitive means.

4. A bus bar as in claim 1 wherein:
   said conductive outer surfaces of said capacitive means are rougher than said inwardly facing surfaces of said conductive elements.

5. A bus bar as in claim 4 wherein:
   the differential roughness between the conductive outer surfaces of said capacitive means and the inwardly facing surfaces of said conductive plates is on the order of at least 300 microinches.

6. A bus bar as in claim 4 including:
   insulating spacer means between said conductive elements, said spacer means having opening for said capacitive means.

7. A multilayer bus bar including:
   first and second spaced apart generally flat conductive bus bars, said first and second bus bars having opposed inwardly facing surfaces having a first surface roughness;
   a plurality of generally flat capacitive chips between said first and second bus bars, said chips having a dielectric center between conductive outer surfaces of a second surface roughness;
   said second surface roughness of said conductive surfaces of said chips being different than said first surface roughness of said bus bars;
   at least part of each conductive outer surface of each capacitive chip being in physical and electrical contact with at least part of the adjacent inwardly facing surface of a bus bar; and
   nonconductive adhesive bonding said bus bars to said chips.

8. A multilayer bus bar as in claim 7 wherein:
   the differential surface roughness between said first and second surface roughnesses is on the order of at least 300 microinches.

9. A multilayer bus bar as in claim 7 including:
   insulating spacer means between said bus bars, said spacer means having a plurality of openings for said chips.

10. A multilayer bus bar as in claim 7 wherein:
    said conductive outer surfaces of said chips have a surface roughness greater than the surface roughness of said inwardly facing surfaces of said bus bars.

11. A multilayer bus bar as in claim 10 wherein:
    the differential surface roughness between said first and second surface roughnesses is on the order of at least 300 microinches.

12. A multilayer bus bar as in claim 10 including:

insulating spacer means between said bus bars, said spacer means having a plurality of openings for said chips.

13. The process of forming a multilayer bus bar, including the steps of:
forming a pair of generally flat conductive bus bars, applying nonconductive adhesive to inward surfaces of each bus bar;
forming capacitive chips having a dielectric center between conductive outer surfaces;
the surface roughness of said outer surfaces of said chips being different from the surface roughness of said inward surfaces of said bus bars;
positioning said chips on an inward surface of one of said bus bars;
positioning another of said bus bars on said chips to form a sandwich assembly of said chips between said bus bars;
bonding said assembly under heat and pressure to effect direct physical and electrical contact between said bus bars and chips and physically bond said bus bars to said chips.

14. The process as in claim 13 wherein:
the differential roughness between said outer surfaces of said chips and the inward surfaces of said bus bars is on the order of at least 300 microinches.

15. The process as in claim 13 including the steps of:
forming a spacer having openings therein;
positioning said spacer on said inward surface of said one bus bar; and
positioning said chips in said openings.

16. The process of claim 13 wherein:
the surface roughness of said outer surfaces of said chips is greater than the surface roughness of said inward surfaces of said bus bars.

17. The process as in claim 16 wherein:
the differential roughness between said outer surfaces of said chips and the inward surfaces of said bus bars is on the order of at least 300 microinches.

18. The process as in claim 16 including the steps of:
forming a spacer having openings therein;
positioning said spacer on said inward surface of said one bus bar; and
positioning said chips in said openings.

* * * * *